United States Patent [19]

Maixner et al.

[11] 4,205,232
[45] * May 27, 1980

[54] ARRANGEMENT FOR PREVENTING THE ALTERATION OF THE PRIMARY BEAM BY UNWANTED PARTICLES, SUCH AS SPUTTER PRODUCTS, CHARGED IONS AND ELECTRONS AND THEIR SECONDARY PROCESSES

[75] Inventors: Uwe Maixner, Barum; Dieter Milferstädt, Tespe-Bütlingen, both of Fed. Rep. of Germany

[73] Assignee: Gesellschaft für Kernenergieverwertung in Schiffbau und Schiffahrt mbH, Geesthact-Tesperhude, Fed. Rep. of Germany

[*] Notice: The portion of the term of this patent subsequent to Oct. 31, 1995, has been disclaimed.

[21] Appl. No.: 937,729

[22] Filed: Aug. 29, 1978

Related U.S. Application Data

[63] Continuation-in-part of Ser. No. 827,307, Aug. 24, 1977, Pat. No. 4,123,655.

[30] Foreign Application Priority Data

Jul. 19, 1978 [DE] Fed. Rep. of Germany ....... 2831791

[51] Int. Cl.² ..................... H01J 35/16; G01K 1/08
[52] U.S. Cl. ..................... 250/397; 250/311; 250/508; 313/174
[58] Field of Search ............ 250/311, 441, 526, 447, 250/397, 508; 313/174, 178

[56] References Cited

U.S. PATENT DOCUMENTS

| | | | |
|---|---|---|---|
| 2,886,730 | 5/1959 | Sheldon | 313/178 |
| 3,727,089 | 4/1973 | Chow | 313/178 |
| 4,123,655 | 10/1978 | Maixner et al. | 250/457 |

OTHER PUBLICATIONS

Electron Tubes by Walter H. Kohl, "Getter Material ...", Chap. 16, pp. 574–577.

Primary Examiner—Harold A. Dixon
Attorney, Agent, or Firm—Becker & Becker, Inc.

[57] ABSTRACT

An arrangement relating to the prevention of the alteration of the primary beam by unwanted particles, such as sputter products, charged ions and electrons and their secondary processes, and to the resulting local improvement in the operational vacuum in electron-beam devices, ion-beam devices and in electron-energy analyzers and ion-mass analyzers using only three-dimensional metallic microstructures known as particle traps. Substantially, all the flat parts of the components of the instrument seen by the beams, such as electrodes, diaphragms, screening plates, housing walls and the like, consist of a metal having a low atomization rate and a very low desorption rate, such as titanium or zirconium or similar substances and their alloys. Apertures of less than 0.5 mm in diameter, situated close beside one another and extending substantially perpendicular to the surface, are provided in the surfaces of the components of the instrument, between which apertures a lattice structure remains located in the surface, the depth of the apertures being equal to or larger than their opening cross-section and the total cross-sectional area of the apertures corresponding to at least half the metal surface occupied thereby.

17 Claims, 7 Drawing Figures

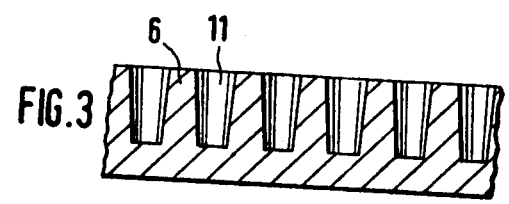
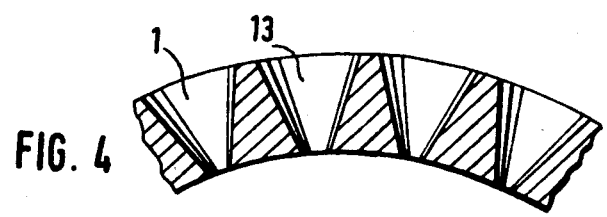
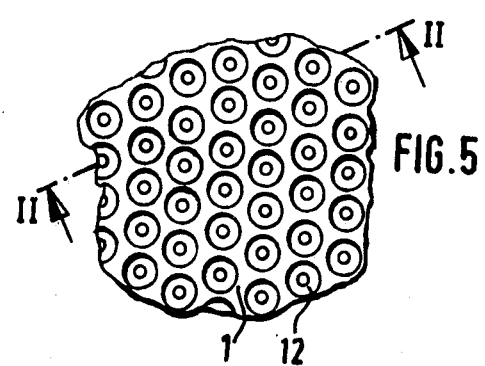

ARRANGEMENT FOR PREVENTING THE ALTERATION OF THE PRIMARY BEAM BY UNWANTED PARTICLES, SUCH AS SPUTTER PRODUCTS, CHARGED IONS AND ELECTRONS AND THEIR SECONDARY PROCESSES

BACKGROUND OF INVENTION

This is a continuation in part of co-pending application Ser. No. 827,307, Maixner, et al, filed Aug. 24, 1977, now U.S. Pat. No. 4,123,655 - Maixner, et al issued Oct. 31, 1978.

The previously known devices, acting exclusively as particle traps, for such beams present in evacuated vessels consist of a sponge-like sintered metal or graphite structure which is applied, for example, to the anode of an electron tube. This involves the disadvantage, however, that the very large surface of the particle trap which is desirable in itself, can only be degassed with difficulty and naturally has too large an internal labyrinth surface which cannot be used as a particle trap and thus is superfluous. In devices in which such particle traps are installed, a very good operational vacuum is required in order to exclude disturbing effects as a result of residual gas which is otherwise present. In addition, the irregular surface of these above-mentioned structures involves the risk of field distortion.

SUMMARY OF INVENTION

It is therefore, an object of the present invention to eliminate the above mentioned disadvantages and to solve the following problems:

1. The development of the various emitted particles should be drastically restricted.
2. The corresponding components of the various devices should be so constructed that they cooperate as an active system improving the vacuum by the influence of the beam current in the interaction region.
3. The residual emissions should be trapped to a greater extent than hitherto.
4. Local field distortions as a result of projecting surface portions should be avoided.
5. Local charging regions as a result of the formation of insulating oxide layers should be avoided.
6. The vaporization of insulator surfaces by sputter products should be avoided.

These and other objects and advantages of the invention will appear more clearly from the following specification in connection with the accompanying drawings, in which:

DESCRIPTION OF DRAWINGS

FIG. 3 shows the enlarged detail III of FIG. 1.

FIG. 4 shows the enlarged detail IV of FIG. 1.

FIG. 5 shows a view in the direction of the arrow V of FIG. 2.

DESCRIPTION OF INVENTION

Figure 1:
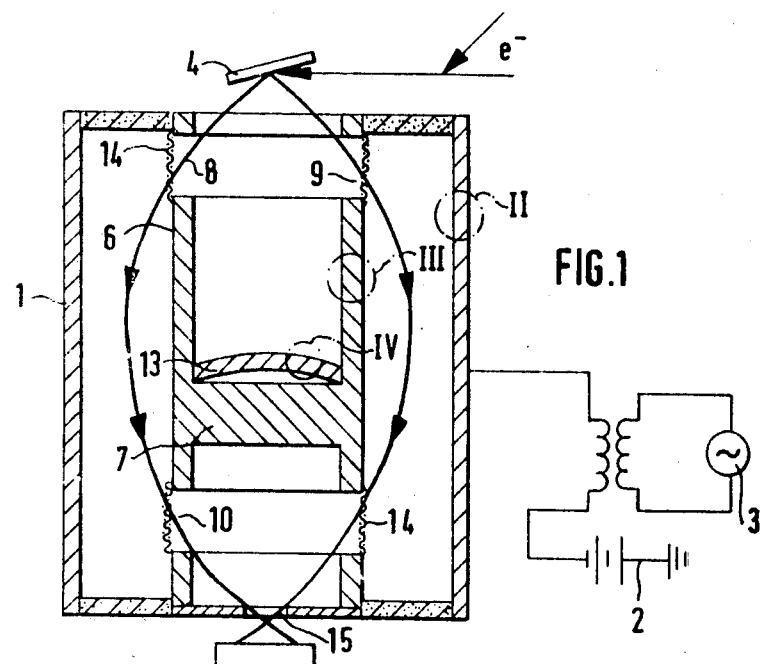
FIG. 1 diagrammatically shows an electron-energy analyzer as one of the fields of application of the invention.

The electron or ion beam instrument according to the invention is characterized primarily in that substantially all flat parts of the instrument components of the device seen by the rays, such as electrodes, diaphragms, screening plates, housing walls and the like, consist of a metal having a low atomization rate and a very low desorption rate, such as titanium or zirconium or similar materials and their alloys, and that apertures of less than 0.5 mm diameter, which are situated close together and extend substantially perpendicular to the surface are provided in the surfaces of the components of the instrument. Between said apertures there remains a lattice structure located in the surface. The depth of the apertures is equal to or greater than their opening cross-section, and the whole cross-sectional area of the apertures corresponds to at least half of the metal surface occupied thereby.

Since the said materials and their natural surface have a low atomization rate and a very low desorption rate, the surface coatings and surface layers, which are scarcely still vaporized or atomized on the impact of the beams, are not emitted but migrate into the metal. Furthermore, since the said metals have a very low secondary electron emission of less than "1," less than one further secondary particle is emitted on the impact of a primary particle or (corresponding to a ping-pong effect) secondary particle. It is also significant that now, according to the invention, all the surfaces seen by the beam act as an active system improving the vacuum and as a result are effective primarily locally where the best operating conditions are needed, namely along the region of the primary beam.

The apertures are either blind holes or through-bores which do not distort and alter the radiation field and so do not in any way have an adverse effect on the field characteristics of the apparatus equipped with such an instrument. Blind holes are always used when the absorbed particles should not pass through to the back of the material. Particularly satisfactory results can be achieved if the recess occupy about 65 to 85% of the surface of the device. In view of multiple reflections of the secondary electrons in the apertures, it is an advantage if these apertures converge in the direction of incidence of the rays. Such recesses can be produced in a particularly simple manner by electron-beam or laser-beam perforation. With this production, the ray inlets are necessarily slightly larger than the ray outlets.

Experience with the present invention has shown that, with a mass spectrometer for example, a very considerable increase in the measuring sensitivity can be achieved. The result depends partly on the fact that in the instruments used hitherto, an operational vacuum originally prevailing in the interior of the mass spectrometer, for example, is locally very considerably impaired by the desorbing action of the electron-ion beam. A deterioration in the vacuum hitherto occurred in the region of the separating electrode as a result of the secondarily emitted particles and in particular as a result of the vaporized (desorbed) residual gas.

The arrangement according to the invention can be used to advantage, for example for electron guns for welding, drilling, perforating etc., precision electron-beam micro-oscillographs, electron accelerators, television camera tubes, electron-beam microprobes, electron microscopes, raster electron microscopes, electron energy analyzers, ion guns for working material, ion guns for material analysis, quadrupole mass spectrometers and their special ion sources and optical systems, electron diffraction devices, poleshoe plate covering in raster electron microscopes, image converters and image intensifiers, ion microprobes, X-ray source equipment and ultra-violet sources. In fact the invention is applicable to instruments which produce, process, transmit or utilize and electron or ion beam and the term electron or ion beam instrument is here used within this scope.

Referring now to the drawings in detail, FIG. 1 shows that the electron-energy analyzer consists of two coaxial cylinders which are accommodated in an evacuated housing, not illustrated. The outer cylinder 1 is connected to a direct-voltage source 2 and receives, superimposed upon the direct voltage, an alternating voltage from an alternating-voltage source 3. As a result, the electron beam, incident at E, after impinging on a specimen 4 is deflected as a primary beam towards the annular gap 9 and through the latter into the energy analyzer. The inner cylinder contains a partition 7 so that the primary electron beam 8 leaving the specimen cannot reach the SEV (secondary electron multiplier) directly. Thanks to the variable field construction with direct and alternating voltage sources, a lobar electron path develops in the analyzer which, beginning from above at the annular gap 5, penetrates through the space between the outer and inner cylinder and then reaches the SEV through the annular gap 10 of the inner cylinder and further through the diaphragm 15.

In the specific embodiment shown, the inner cylinder 6 may consist of a zirconium or titanium tube perforated by an electron beam. This inner cylinder 6 contains, at its outside, closely adjacent blind bores 11 (FIG. 3) which absorb the unwanted primary electrons sorted out by energy selection and other particles but do not alter the outer surface of the inner cylinder electron-optically so that the electron-optical characteristics of the analyzer are retained.

The apertures 9 and 10 which are provided over the periphery of the inner cylinder 6 at the upper and lower ends and which are comparatively large cannot be produced in the above-mentioned uniform microstructure because no reflections at walls of perforations are wanted at these points. For this reason, the relatively large apertures at the upper and lower ends of the inner cylinder are covered with a thin wire netting 14 of zirconium or titanium. This wire grating is so thin that no reflections can occur as with the above-mentioned perforations.

Figure 2:
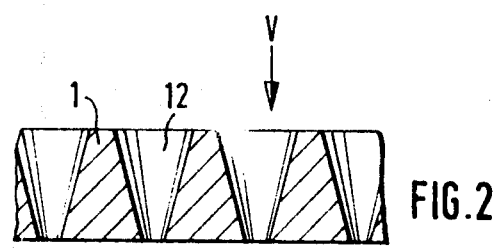
FIG. 2 shows the enlarged detail II of FIG. 1 in a section on the section line II—II of FIG. 5.
Figure 6:
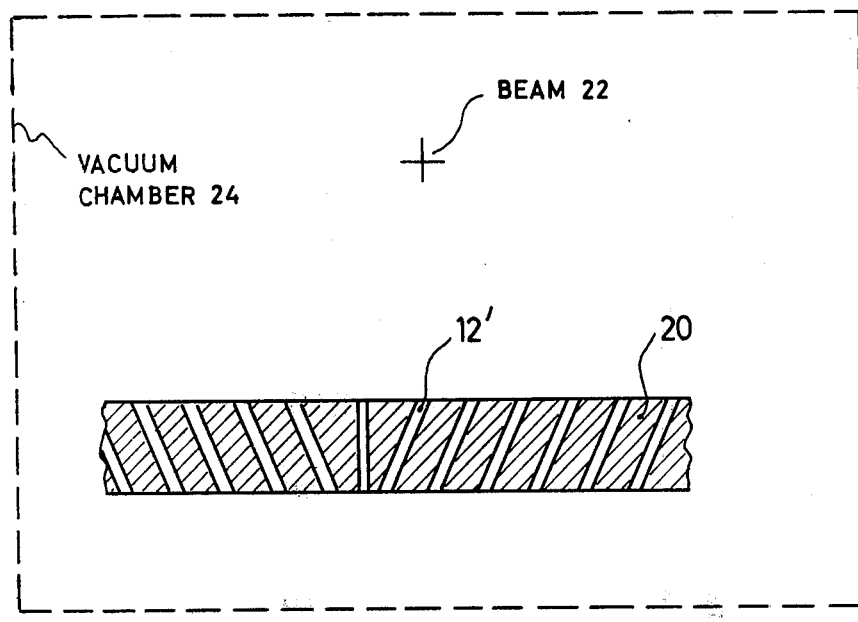
FIGS. 6 and 7 show further embodiments.

In contrast to the inner cylinder 6, the outer cylinder 1 of the electron-beam analyzer can be provided with through-perforations or through-holes 12 so that also the unwanted partial streams of particles released by the electron beam can migrate to the outside (FIGS. 2 and 6).

According to the invention, the partition 7 provided in the inner cylinder may likewise be made of zirconium or titanium sheet which is provided with blind holes 11 situated close beside one another at the side adjacent to the specimen 4. A second possibility consists in constructing the partition in the form hitherto customary and placing a plane or spherical zirconium or titanium disc 13 over this continuous wall, which disc can then be provided with through apertures 12 (FIG. 4).

According to the invention, all the surfaces seen by the beam are provided with through perforations or with blind holes. These above-mentioned surfaces include all the electrodes, screening plates, diaphragms or the like starting from the beam production to the beam reception. For example, according to the present invention, in a quadrupole analyzer, the four pole bars consisting of solid metal and the tube surrounding them can be from the said materials in the manner according to the invention and then receive blind holes close beside one another at their surface. It may be mentioned once again that, according to the proposals of the invention, not only are the unwanted secondary particle streams trapped but also the production of these secondary particle streams is very drastically reduced by the appropriate selection of material and the proposed surface structure. It is known that even carefully cleaned always have numerous surface coatings in the form of gases, lubricants, dust and the like. If, as was hitherto customary, other materials than those mentioned were to be used, there would be a great emission of seconary particle streams which, inter alia, would cause a deteriation in the vacuum locally, which now does not happen with the construction of the components in the form of an active system which improves the vacuum.

It may also be mentioned that the perforations provided according to the invention extend substantially perpendicular to the surface. As a result, there is an optimum ratio between the electron-optically effective surface and the total surface, that is to say outside face plus wall faces of the apertures. In this connection, it would be noted that practically all analyzers and similar devices have to be opened, that is to say freed of the vacuum, during the change of specimen and change of cathode or the like. In this ventilated stage, all the surfaces are covered and are only freed of gas again after the device has again been made ready for operation by applying a vacuum. The enlargement of the surface achieved by the perforations is just as large as is necessary for the intended effect of the device but not nearly so great that too large a labyrinth surface is obtained which is harmful to satisfactory working vacuum conditions and redundant, as with sintered particle traps.

Thus, the device according to the invention largely solves the problem of self-destruction of the parts seen by the primary beam by atomization with the associated short life in systems producing electron or ion beams. Nor is there any reduction in performance as a result of the sputter products moving with high energy in the path of rays. The problem of unstable power behavior is also solved, which problem is caused by the fact that the sputter products vaporizing on insulators alter the insulation values. Furthermore, the problem of interaction of the primary beam with sputter products and the surfaces seen by the beam is solved. In energy or mass analyzers, the problem of the secondary-secondary effects together with the problem of low transmission is solved. Thus there is a considerable improvement in the performance and in the signal-to-noise ratios in all systems producing or processing electron beams or ion beams.

There is to be understood that also in accordance with the present disclosure there is to be provided an electron or ion beam instrument having a surface of the instrument along the beam path or defining or positioned within a vacuum chamber transversed by said beam and subject to be encountered by unwanted particles which may be e.g. particles forming the beam and scattered out of the regular beam path by collision with e.g. residual gas particles or residual gas particles hit, ionized and accelerated by particles forming the beam. The surface is formed from a metal having a low atomization rate and a very low desorption rate and also provided with closely spaced apertures extending at an incline to the surface with a diameter of less than 0,5 mm, the depth of the apertures being at least equal to their opening cross-section and the total cross-sectional area surface in which they are provided.

As shown in FIG. 6, the inclination of each aperture 12' of a plate-shaped member 20 of a beam apparatus is advantageously chosen such that no straight line can be drawn through an aperture from any point of the beam path 22. This secures interception of any particles originating at the beam path and propagating in the direction of the apertured member 20. It is to be understood, that in operation of the apparatus an appropriate vacuum is maintained in a chamber 24 in which the beam is produced and propagated. Generally, in charged particle beam apparatus, the mean free path of any particles is great in relation to the dimensions of the apparatus itself, so that the path of any particle follows generally a straight line within the vacuum confinement of the apparatus.

Figure 7:
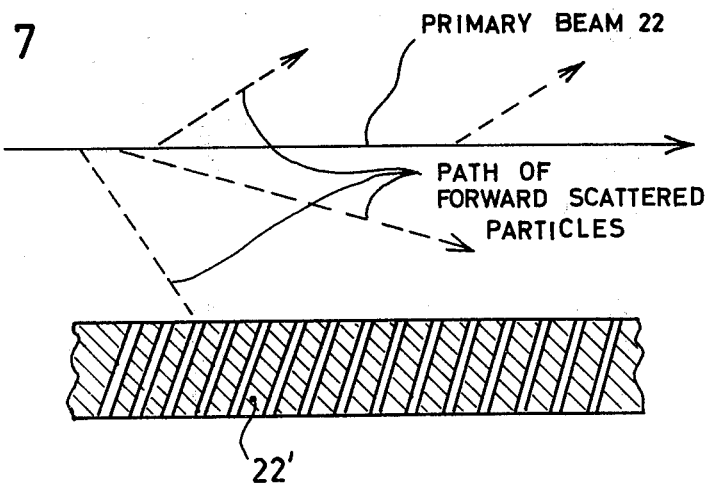

A inclination pattern of the apertures as shown in FIG. 7 can be used with advantage if only particles are to be intercepted which are scattered in a forward direction by the beam. Also in this case (with the above assumption of only forward scattering), the apertured member 22' is nondiaphanous (impervious or opaque or nontransparent in a particle-optical sense) for any particles produced by the beam at the beam path.

As in the previous examples, the member 22 or 22' is made of a metal of low atomization or sputter rate and low desorption rate, as e.g. titanium or zirconium and their alloys.

The apertures may also be produced by a chemical etching process.

The invention is preferably used with a surface which during normal operation of the apparatus is not scanned or encountered by the beam itself.

In summary, there is provided an electron or ion beam instrument having a surface of the instrument seen by the beam formed from a metal having a low atomization rate and a very low desorption rate and provided with closely spaced apertures of less than 0,5 mm diameter, the depth of the apertures being at least equal to their opening cross section and the total cross sectional area of the apertures corresponding to at least half of the metal surface in which they are provided.

It is, of course, to be understood that the present invention is, by no means, limited to the specific showing in the drawings but also comprises any modifications within the scope of the pendend claims.

What we claim is:

1. An electron or ion beam instrument having a surface of the instrument along the beam path formed from a metal having a low atomization rate and a very low desorption rate and also provided with closely spaced apertures extending an incline to the surface with a diameter of less than 0.5 mm, the depth of the apertures being at least equal to their opening cross section and the total cross sectional area of the apertures corresponding to at least half of the metal surface in which they are provided.

2. An instrument according to claim 1, in which the apertures are produced by being chemically etched into the metal surface.

3. An instrument according to claim 1, in which the surface during normal operation thereof is free of being encountered by the beam itself.

4. An instrument according to claim 3, in which the surface is capable of being seen from the beam path.

5. An instrument according to claim 3, in which the surface adjoins the beam path in a vacuum system in which free path length is very great and particles correspondingly cover large distances.

6. An instrument according to claim 1, in which the apertures pass through the metal at an angle so that straight line passage therethrough is non-existent and the aperture as seen from the beam path are nondiaphanous.

7. An electron or ion beam instrument having a surface of the instrument which, during operation of the instrument adjoins an evacuated space communicating with a beam path region, is formed from a metal having a low atomization rate and a very low desorption rate and is provided with closely spaced apertures of less than 0,5 mm diameter, the depth of the apertures being at least equal to their opening cross section and the total cross sectional area of the apertures corresponding to a least half of the metal surface in which they are provided.

8. An instrument according to claim 7 wherein each aperture has an orientation with respect to said surface such that no straight line forming an angle of 90 degrees and less with the direction of the beam path can pass freely through said aperture.

9. An instrument according to claim 8, in which said surface is formed by a material comprising titanium.

10. An instrument according to claim 8 in which said surface is formed by a material comprising zirconium.

11. An electron or ion beam instrument having a surface of the instrument along the beam path formed from a metal having a low atomization rate and a very low desorption rate and also provided with closely spaced apertures extending an incline to the surface with a diameter of less than 0,5 mm, the depth of the apertures being at least equal to their opening cross section and the total cross sectional area of the apertures corresponding to at least half of the metal surface in which they are provided.

12. An instrument according to claim 11 in which the apertures are produced by being chemically etched into the metal surface.

13. An instrument according to claim 11, in which the surface during normal operation thereof is free of being encountered by the beam itself.

14. An instrument according to claim 11, in which the apertures pass through the metal at an angle so that straight line passage therethrough is non-existent and the aperture as seen from the beam path are nondiaphanous.

15. An instrument according to claim 13 in which the surface is positioned so that it is capable of being seen from the beam path.

16. An instrument according to claim 15 in which the surface is capable of being seen from the beam path.

17. An instrument according to claim 15 in which the surface adjoins the beam path in a vacuum system in which free path length is very great and particles correspondingly cover large distances.

* * * * *